(12) United States Patent
Strogies et al.

(10) Patent No.: US 11,285,568 B2
(45) Date of Patent: Mar. 29, 2022

(54) SOLDER PREFORM FOR ESTABLISHING A DIFFUSION SOLDER CONNECTION AND METHOD FOR PRODUCING A SOLDER PREFORM

(71) Applicant: Siemens Aktiengesellschaft, Munich (DE)

(72) Inventors: Jörg Strogies, Berlin (DE); Klaus Wilke, Berlin (DE); Christian Schellenberg, Potsdam (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 210 days.

(21) Appl. No.: 16/607,574

(22) PCT Filed: Apr. 23, 2018

(86) PCT No.: PCT/EP2018/060296
§ 371 (c)(1),
(2) Date: Oct. 23, 2019

(87) PCT Pub. No.: WO2018/197390
PCT Pub. Date: Nov. 1, 2018

(65) Prior Publication Data
US 2020/0147731 A1      May 14, 2020

(30) Foreign Application Priority Data
Apr. 25, 2017   (DE) .................... 10 2017 206 932.5

(51) Int. Cl.
*B23K 35/00*   (2006.01)
*B23K 35/02*   (2006.01)
(Continued)

(52) U.S. Cl.
CPC .......... *B23K 35/025* (2013.01); *B23K 35/262* (2013.01); *B23K 35/302* (2013.01); *B23K 2101/36* (2018.08)

(58) Field of Classification Search
CPC .. B23K 35/025; B23K 35/262; B23K 35/302; B23K 2101/36–42; B23K 35/0244;
(Continued)

(56) References Cited

U.S. PATENT DOCUMENTS 5,118,029 A * 6/1992 Fuse .................... H05K 3/3485
                                                      228/198
11,049,833 B2 * 6/2021 Seddon .................. H01L 24/13
(Continued)

FOREIGN PATENT DOCUMENTS

DE  10 2013 219 642 A1   4/2015  ............... B23K 1/00
EP     0 608 905 A1      8/1994  ............. B23K 35/14
(Continued)

OTHER PUBLICATIONS

Japanese Office Action, Application No. 2019558564, 16 pages, dated Oct. 27, 2020.
(Continued)

*Primary Examiner* — Kiley S Stoner
(74) *Attorney, Agent, or Firm* — Slayden Grubert Beard PLLC

(57) ABSTRACT

Various embodiments include a solder preform for establishing a diffusion solder connection comprising: a microstructure including a solder material and a metallic material; a first joining surface for a first joining partner and a second joining surface for a second joining partner; and a diffusion zone comprising an intermetallic compound of at least some of the solder material and at least some of the metallic material. The first joining surface and the second joining surface include at least some solder material.

14 Claims, 5 Drawing Sheets

(51) Int. Cl.
 B23K 35/26 (2006.01)
 B23K 35/30 (2006.01)
 B23K 101/36 (2006.01)
(58) Field of Classification Search
 CPC .... B23K 35/0238; B23K 35/0233–025; B23K
 1/0016; H01L 2224/2711; H01L
 2224/29076; H01L 2224/29078; H01L
 2224/271; H01L 2224/29211; H01L
 2224/29294; H01L 2224/32507; H01L
 2224/29347; H01L 24/32; H01L 24/83;
 H01L 2224/2732; H01L 2224/2908;
 H01L 2224/29111; H01L 2224/29147;
 H01L 2224/32245; H01L 2224/83825;
 H01L 24/27; H01L 24/29; H01L 24/743;
 H01L 2224/27848; H01L 2224/29247
 USPC ................ 228/179.1–180.22, 56.3, 245–246
 See application file for complete search history.

(56) References Cited

U.S. PATENT DOCUMENTS

| | | | |
|---|---|---|---|
| 2006/0061974 A1 | 3/2006 | Soga | 361/743 |
| 2009/0004500 A1 | 1/2009 | Suh | 428/576 |
| 2009/0008431 A1* | 1/2009 | Zonvide | H05K 9/0015 228/179.1 |
| 2009/0236725 A1 | 9/2009 | Hirano | 257/690 |
| 2010/0291399 A1 | 11/2010 | Kato | 428/553 |
| 2011/0068149 A1* | 3/2011 | Hirano | C22C 13/00 228/56.3 |
| 2013/0299236 A1* | 11/2013 | Nakano | C22C 9/06 174/84 R |
| 2015/0155402 A1 | 6/2015 | Sagawa | 136/256 |
| 2016/0219720 A1 | 7/2016 | Strogies | 361/760 |
| 2016/0358884 A1 | 12/2016 | Cavasin | 257/704 |
| 2017/0232562 A1* | 8/2017 | Maeno | B23K 35/0238 228/262.61 |
| 2018/0102464 A1* | 4/2018 | de Avila Ribas | B23K 1/0016 |
| 2018/0218954 A1* | 8/2018 | Sekine | B23K 35/302 |

FOREIGN PATENT DOCUMENTS

| | | | |
|---|---|---|---|
| EP | 2 617 515 A1 | 7/2013 | B23K 35/14 |
| JP | 2004174522 A | 6/2004 | B23K 1/00 |
| JP | 2013212524 A | 10/2013 | B23K 1/00 |
| JP | 2014180690 A | 9/2014 | B23K 34/14 |

OTHER PUBLICATIONS

Search Report for International Application No. PCT/EP2018/059971, 12 pages, dated Jul. 27, 2018.
Search Report for German Patent No. 10 2017 206 932.5, 9 pages, dated Feb. 22, 2018.
Feil, Daniel et al; „Fügekonzepte für Leistungsmodule an Kühlkörpem, Elektronische Baugruppen und Leiterplatten, Seiten 59-64; ISBN 978-3-8007-4147-2; 2016, Feb. 7, 2016.
Kotadia, H.R. et al., "Massive Spalling of Cu—Zn and Cu—Al Intermetallic Compounds at the Interface Between Solders and Cu Substrates During Liquid State Reaction," Journal of Applied Physics III, 074902, 6 pages, Apr. 4, 2012.
European Office Action, Application No. 18723722.7, 8 pages, dated Sep. 4, 2020.

* cited by examiner

SOLDER PREFORM FOR ESTABLISHING A DIFFUSION SOLDER CONNECTION AND METHOD FOR PRODUCING A SOLDER PREFORM

CROSS-REFERENCE TO RELATED APPLICATIONS

This application is a U.S. National Stage Application of International Application No. PCT/EP2018/060296 filed Apr. 23, 2018, which designates the United States of America, and claims priority to DE Application No. 10 2017 206 932.5 filed Apr. 25, 2017, the contents of which are hereby incorporated by reference in their entirety.

TECHNICAL FIELD

The present disclosure relates to soldering. Various embodiments include solder preforms for establishing a diffusion solder connection with a first joining surface for a first joining partner and a second joining surface for a second joining partner.

BACKGROUND

The use of diffusion solder connections for assembling two joining partners is described, for example, in DE 10 2013 219 642 A1. When diffusion solder connections are formed between the joining partners, a solder connection forms as a result of diffusion procedures which comprises an inter-metallic phase, which has a higher melting point than the remaining solder connection consisting of the solder alloy. In this way, it is possible to thermally and mechanically stabilize the connection between the joining partners.

The joining partners can provide contact materials made of copper, for example. The diffusion solder can be a solder material containing tin. Due to the diffusion of copper into the solder material during the formation of the solder connection, a diffusion zone then results, which is formed by an intermetallic compound between copper and tin. It has a melting point of approximately 420°, which is thus unambiguously above the melting temperature of the tin-based solder material. As a result of the required diffusion procedures, the diffusion zone cannot extend arbitrarily deep into the solder material. The solder connection to be formed is therefore restricted to a specific thickness.

DE 10 2013 219 642 A1 suggests at least one of the joining partners be formed in such a way that cavities result in the region of the joining gap between the joining partners. These cavities can be formed, for example, by providing depressions in the assembly surface of one of the joining partners. They are then used as buffer spaces during the joining, into which excess solder material can escape, so that even if quantity tolerances occur, a gap width between the joining partners can be guaranteed which ensures the reliable formation of a diffusion zone over the entire width of the joining gap.

D. Feil: "Fügekonzepte für Leistungsmodule an Kühlkörpern [Joining concepts for power modules on heatsinks]", Elektronische Baugruppen and Leiterplatten [Electronic assemblies and printed circuit boards], pages 60-64, Berlin, Offenbach, 2016, describes during the formation of diffusion solder connections, larger joining gaps between the joining partners can also be bridged if a flexible preform, for example a copper net, is inserted into the joining gap. A solder foil can be placed thereon, wherein the solder material fills up the intermediate spaces between the flexible preform upon liquefying. In this case, the preform provides the material which can diffuse into the solder material. Because the diffusing material is available not only through the interfaces of the joining partner, but rather also in the interior of the solder connection, a continuous diffusion zone can form between the joining partners even in the case of a larger joining gap.

Feil also describes another option of the formation of diffusion solder connections, in which a metallic powder, for example copper powder, is used instead of the flexible preform. This powder is admixed to the solder material and provides the material, distributed dispersed in the solder material, which can diffuse into the solder connection to form the diffusion zone. A diffusion zone which bridges the gap between the two joining partners may also be established in the solder connection in this way.

US 2009/004500 A1 describes diffusion solder connections between two joining partners established by diffusion of constituents from a liquid phase into a solid phase during the soldering. In this case, a solder material containing two components is used between the joining partners. To be able to establish the solder connection, a solder preform is placed between the joining partners, which consists of a sandwich of layers of the first component and the second component. In this way, it is possible to keep the diffusion paths for the diffusing element as short as possible, so that a mechanically stable connection results between the joining partners.

The use of solder preforms requires a high level of precision during the establishment of solder connections, since they have to touch to form a reliable contact of both joining partners and the diffusion paths in the forming solder connection cannot be excessively large. This precision is linked to a certain manufacturing effort and costs thus resulting. To keep the diffusion paths short, particularly thin solder preforms can be used. However, these require a very flat and clean surface of the joining partners and elevated demands on the joining accuracy. Arbitrarily thin preforms also may not be produced for the purpose of shortening the diffusion paths. The time which is required for the phase growth of an intermetallic phase also may not be minimized arbitrarily. The thermal strain of the joining partners also has to be taken into consideration, which limits the permissible treatment times of a heat treatment.

SUMMARY

The teachings of the present disclosure include solder preforms for the diffusion soldering or a method for producing such a solder preform, respectively, wherein the solder preform is to be simple in the handling and assembly of the diffusion solder connection and the thermal strain during the joining of the diffusion solder connection is to be comparatively small. For example, some embodiments include a solder preform for establishing a diffusion solder connection, comprising a first joining surface (12) for a first joining partner (14) and a second joining surface (13) for a second joining partner (17), made of a microstructure, comprising a first phase (20) made of a solder material and a second phase (18) made of a metallic material, characterized in that a diffusion zone (19) consisting of the material of the first phase (20) and the material of the second phase (18) is formed in the solder preform, wherein the first joining surface (12) and the second joining surface (13) are entirely or partially formed by the first phase (20), and the diffusion zone (19) comprises an intermetallic compound.

In some embodiments, a minimum distance, which is in the range of at least 1 μm and at most 30 μm, or at least 5

μm and at most 10 μm, exists between the diffusion zone (19) and the first joining surface (12) and also between the diffusion zone (19) and the second joining surface (13).

In some embodiments, a distance, which is in the range of at least 1 μm and at most 30 μm, or at least 5 μm and at most 10 μm, exists between the diffusion zone (19) and the first joining surface (12) and also between the diffusion zone (19) and the second joining surface (13), said distance between the diffusion zone (19) and the first joining surface (12) and also between the diffusion zone (19) and the second joining surface (13) is present in a region below the joining surface (12) of at least 50%, at least 70%, and/or of at least 90%.

In some embodiments, the intermetallic compound is formed to a sufficient extent that a complete permeation of the solder preform by the diffusion zone from the first joining surface (12) to the second joining surface (13) can be formed in a soldering time of less than 300 seconds, in particular examples in a soldering time of 60-150 seconds.

In some embodiments, the intermetallic compound is formed to a sufficient extent that a complete permeation of the solder preform by the diffusion zone from the first joining surface (12) to the second joining surface (13) can be carried out in a temperature range of less than 270° C., in particular examples in a temperature range of 220° C. to 260° C.

In some embodiments, the first phase (20) and the second phase (18) are formed as layers in the solder preform, wherein the diffusion zones (19) are respectively formed as intermediate layers between these layers.

In some embodiments, the second phase (18) is formed in the form of particles, which are distributed in a matrix made of the first phase (20).

In some embodiments, the diffusion zone comprises a framework (25), which connects the particles, made of an intermetallic compound.

In some embodiments, the second phase (18) forms an integral spatial structure (26), which is enclosed by a matrix made of the first phase (20).

As another example, some embodiments include a method for producing a solder preform (11), in which a first phase (20) made of a solder material and a second phase (18) made of a metallic material are joined together to form the solder preform, characterized in that the solder preform is subjected to a heat treatment, wherein a diffusion zone (19) having an intermetallic compound between the first phase (20) and the second phase (18) forms during the heat treatment and the first phase (20) remains entirely or partially formed on a first joining surface (12) for a first joining partner (14) and a second joining surface (13) for a second joining partner (17).

In some embodiments, the solder preform (11) is inserted between two holding devices (21), which engage on the first joining surface (12) and the second joining surface (13), during the heat treatment.

In some embodiments, a plate (32) is produced as an intermediate product and a plurality of solder preforms is obtained by dividing the plate (32).

In some embodiments, the first phase (20) is used in the form of layers, and the second phase (18) is used in the form of particles, the layers and the particles are layered alternately, and the particles are embedded in the layers.

In some embodiments, the particles are fixed on the layers using a binder (20*a*), before the layers provided with the particles are layered.

In some embodiments, the second phase (18) is placed in the form of particles or in the form of an integral spatial structure between the holding devices (21) and the second phase (18) is infiltrated by the molten first phase (20).

In some embodiments, the second phase (18) is placed in the form of an integral spatial structure on one of the holding devices (21), the second phase (18) is embedded in the first phase (20) in the form of a solder paste, and the other of the holding devices (21) is placed on the solder preform to be produced.

In some embodiments, the integral spatial structure (26) is embedded between two layers of the solder paste.

In some embodiments, the second phase (18) is used in the form of an integral spatial structure (26) and the spatial structure (26) is immersed in the molten first phase (20).

BRIEF DESCRIPTION OF THE DRAWINGS

Further details of the teachings herein are described hereafter on the basis of the drawings. Identical or corresponding elements of the drawings are each provided with identical reference signs and are only explained multiple times insofar as differences result between the individual figures. In the figures.

DETAILED DESCRIPTION

Figure 1:
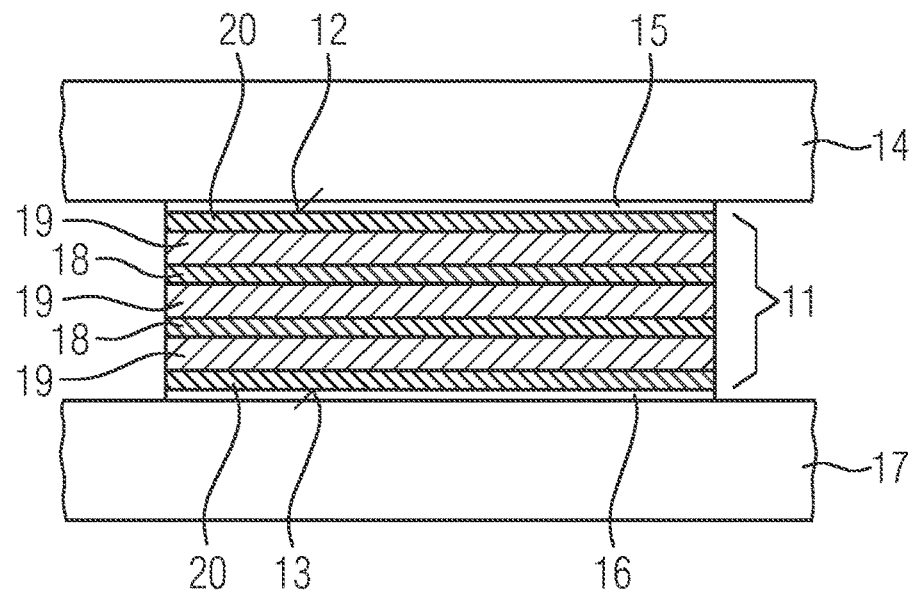
FIG. 1 shows an example embodiment of a solder preform incorporating teachings of the present disclosure, in which the second phase is formed by individual layers, in section.

Various embodiments of the teachings herein include a solder preform with a diffusion zone consisting of the material of the first phase and the material of the second phase formed in the solder preform, wherein the first joining surface and the second joining surface are entirely or partially formed by the first phase. In this case, the first phase and the second phase are soluble in one another, e.g., the metallic material of the second phase diffuses into the first phase if the thermal energy is sufficient for this purpose. This is the case in particular if the first phase made of the solder material is melted for the purpose of forming the diffusion solder connection. The second phase has a higher melting point in this case and is therefore not melted during the formation of the diffusion solder connection. The diffusion procedures result at the end in the formation of an intermetallic phase, which is formed from components of the first phase and the second phase and has a higher melting point than the solder material. The first phase can be, for example, a tin-based solder material (in particular a tin-silver-copper solder, for example SAC305 having the alloy composition SN96.5Ag3Cu0.5 or a tin-copper solder, for example having the alloy composition Sn99.3Cu0.7), while the second phase consists of a metal which dissolves in the first phase and can diffuse therein, preferably copper.

In some embodiments, the diffusion zone which is formed in the solder preform has not yet reached the final stage of the diffusion procedure. The solder preform may thus still be used in the scope of a diffusion solder procedure to connect two joining partners using a diffusion solder connection. The first joining surface and the second joining surface are available for this purpose, wherein the first phase is still formed at these two joining surfaces in particular. The solder material is thus still available to form a diffusion zone, which can be formed, for example, in that the joining partners contribute the metallic material, which is also present in the second phase, to the formation of the diffusion zone.

During the formation of the diffusion solder connection, the solder preform is heated to a temperature at which further diffusion procedures which complete the formation of the diffusion solder connection occur. In some embodiments, intermetallic phases which also extend up to the joining surfaces and thus result in a reliable diffusion solder connection between the joining partners can form. Before the soldering of the solder preform, the diffusion zone present in the interior can also already at least partially comprise an intermetallic phase. This is dependent on how long the solder preform has been subjected to a heat treatment, which triggers the diffusion.

In some embodiments, a minimum distance in the range of at least 1 μm and at most 30 μm, or at least 5 μm and at most 10 μm, exists between the diffusion zone (19) and the first joining surface (12) and between the diffusion zone (19) and the second joining surface (13). It is ensured by the distance that the diffusion solder connections between the joining partners and the solder preform can be finished with a comparatively small introduction of heat. In some embodiments, the diffusion solder connections are manufactured jointly with further solder connections of an electronic assembly. A substantially higher temperature than for conventional solder connections is normally required for establishing diffusion solder connections. However, due to the diffusion procedures which have already been initiated in the solder preform due to a heat treatment, for example, the formation of the diffusion zone with the intermetallic compound does not have to be completely established by the solder procedure. Therefore, the processing times and temperatures of conventional soldering are sufficient, because of which the assembly can be manufactured in a single soldering procedure, even if conventional solder connections are also to be manufactured in addition to the diffusion solder connections. For example, such an electronic assembly can be soldered in a reflow soldering furnace.

To establish a diffusion zone in the diffusion solder connection which extends from one joining surface up to the other joining surface, the minimum distance does not have to be distributed over the entire surface of the joining surface. The minimum distance is, however, may be present at least in subregions below the joining surface.

In some embodiments, a distance, which is in the range of at least 1 μm and at most 30 μm, or at least 5 μm and at most 10 μm, exists between the diffusion zone (19) and the first joining surface (12) and also between the diffusion zone (19) and the second joining surface (13), wherein said distance between the diffusion zone (19) and the first joining surface (12) and also between the diffusion zone (19) and the second joining surface (13) is present in a region below the joining surface (12) of at least 50%, at least 70%, or even at least 90%. In this way, it can be ensured that a diffusion connection forms at least in the main part of the joining surface. This effectively stabilizes the solder connection, even if residues of the solder material are still present in the solder connection.

In some embodiments, the intermetallic compound is formed to a sufficient extent that a complete permeation of the solder preform by the diffusion zone from the first joining surface (12) to the second joining surface (13) can be formed in a soldering time of less than 300 seconds, in particular in a soldering time of 60-150 seconds. This is because it has been shown that the soldering time can be directly influenced by dimensioning the distances between the diffusion zone and the joining surfaces. In this manner, it is possible to design the solder preform so that it can be soldered in particular with conventional solder connections.

In some embodiments, the intermetallic compound is formed to a sufficient extent that a complete permeation of the solder preform by the diffusion zone from the first joining surface (12) to the second joining surface (13) can be carried out in a temperature range of less than 270° C., in particular in a temperature range of 220° C. to 260° C. This is because it has been shown that a reduction of the soldering temperature is possible by suitable dimensioning of the distances between the diffusion zone and the joining surfaces, wherein this temperature can be set so that the diffusion connection can be soldered jointly with conventional solder connections.

In some embodiments, a first phase made of a solder material and a second phase made of a metallic material are joined to form the solder preform, to form the diffusion zone having an intermetallic compound, it can be provided that a heat treatment is carried out (more in this regard hereinafter). During the application of this method, the heat treatment can be set with respect to its parameters (temperature, heat treatment duration) in such a way that the abovementioned conditions result for the distance between the joining surfaces and the diffusion zone.

In some embodiments, the first phase and the second phase are formed as layers in the solder preform, wherein the diffusion zones are respectively formed as intermediate layers between these layers. In other words, the layers of the first phase and the second phase alternate. Intermediate layers result due to a heat treatment. They are formed by diffusion zones, which grow proceeding from the interface between the first phase and the second phase and can also grow together. The diffusion zones can be converted at least partially into intermetallic compounds if the diffusion has progressed sufficiently far. A simple structure of the solder preform advantageously results in this manner, which can be produced by layers of foils made of the first phase and the second phase.

In some embodiments, the second phase is formed in the form of particles, which are distributed in a matrix made of the first phase. This may be achieved, for example, in that the particles of the second phase are distributed between foils made of the first phase and a bond forming the solder preform is produced therefrom. In some embodiments, the subsequently established diffusion zone comprises a framework, which connects the particles, made of an intermetallic compound. This framework extends over the thickness of the solder preform, whereby the diffusion solder connection formed by the solder preform is mechanically and thermally stabilized. After assembly of the solder preform and diffusion soldering thereof, the framework of the intermetallic compound is completed toward the joining partners, so that it extends up to the joining surfaces. The overall diffusion solder connection is thus stabilized.

In some embodiments, the second phase forms an integral spatial structure, which is enclosed by a matrix made of the first phase. Such an integral spatial structure predetermines the geometry of a framework of the intermetallic compound forming in the first phase, so that it may be formed having defined geometry and therefore well predictable mechanical properties. A framework of the intermetallic phase enclosing the spatial structure, the geometry of which is oriented to the spatial structure of the second phase, also results in this configuration.

In some embodiments, the solder preform is subjected to a heat treatment, wherein a diffusion zone forms between the first phase and the second phase during the heat treatment. A formation of intermetallic compounds can also occur in this diffusion zone. Moreover, the heat treatment may be terminated in a timely manner so that the first phase remains formed entirely or partially at a first joining surface for the first joining partner and at a second joining surface for the second joining partner. In this way, the solder material at the joining surfaces for establishing a solder connection to the adjacent joining partners is ensured. It can be ensured that the first phase is maintained at the joining partners in that the second phase, from which material to form the diffusion zone diffuses into the first phase, is present not at all or only to a minor extent in the regions close to the joining surfaces. Moreover, the formation of a diffusion zone which extends up to the joining surfaces may be influenced by limiting the time for the heat treatment.

In particular, a solder preform may be produced, in the case of which the completion of the diffusion procedures, which are to result during the assembly in the establishment of a diffusion solder connection between two joining partners, is reached more rapidly. The thermal stresses which are linked to the establishment of the solder connection may be reduced in this case.

In some embodiments, the solder preform is inserted during the heat treatment between two holding devices, which engage on the first joining surface and on the second joining surface. These holding devices cannot contain material which diffuses into the solder preform, so that they can be detached from the solder preform again after the heat treatment. For example, the holding devices can consist of ceramic and can be implemented by two flat plates. It is also advantageous if it is difficult to wet the holding devices using the solder material, so that this solder material cannot form a connection to the interfaces of the holding devices. A pressure can be exerted on the solder preform during the heat treatment using the holding devices to connect individual layers to one another and to condition the joining surfaces.

In some embodiments, a plate which has the height of the solder preforms to be produced may be produced as an intermediate product. A plurality of solder preforms can be produced therefrom after completion of the heat treatment by the plate being divided. This can be performed, for example, by stamping, cutting, sawing, abrasive cutting, or laser cutting. On the one hand, the process reliability during the layering of the individual layers may be improved by producing a large plate. In addition, the effort during the layering of the layers may be reduced, since a comparatively small number of components having comparatively large dimensions have to be handled for a plurality of solder preforms. Horizontal layer deviations then only occur at the edge of the plate in each case, for example, and can be cut off easily during the isolation of the solder preforms.

In some embodiments, the first phase is used in the form of layers and the second phase is used in the form of particles. The layers and the particles are then layered alternately and the particles are subsequently embedded in the layers. This embedding process can be performed mechanically, for example, by rolling or pressing. The formation of the composite between the individual layers is additionally assisted by the heat treatment, since the formation of the diffusion zone results in a permanent connection between the particles and the layers.

For example, copper particles in the form of beads can be applied to thin solder foils, in particular a tin-containing solder alloy. In this case, according to one advantageous configuration of the invention, a binder can be used, using which the particles are fixed on the solder foil. If a plurality of these foils is stacked one on top of another, the total height of the solder preform thus produced thus permits a sufficient degree of filling with copper particles to be achieved.

In some embodiments, the first phase in the form of particles or in the form of an integral spatial structure is placed between the holding devices and subsequently this first phase is infiltrated by the previously melted second phase. In this case, the fact is utilized that the second phase has a lower melting temperature than the first phase and is drawn into the intermediate spaces of the first phase as a result of capillary forces. A composite made of the first phase and the second phase advantageously results in this way, wherein the degree of filling and the geometry of the first phase can be precisely predetermined. Because the solder material is introduced in the liquid state into the solder preform, sufficient heat is moreover available so that a diffusion zone forms immediately. The heat treatment step is thus at least partially integrated into the production step of the solder preform, whereby the production time for the preform can advantageously be reduced.

If copper particles are used, they can thus be processed, for example, in the form of a copper paste, by printing it onto a non-wettable surface, for example made of a ceramic. After drying of this particle bond, a solder depot, for example in the form of a preform or a solder paste depot, can be applied laterally to the copper depot. The shaping of the solder preform to be produced toward the upper side is delimited by means of the second holding device, for example of a second ceramic plate. In addition, spacers can be placed between the holding devices for the precise definition of the height of the solder preform to be produced. By melting the solder, it then infiltrates the depot of copper particles.

In some embodiments, the second phase is placed in the form of an integral spatial structure onto one of the two holding devices. Subsequently, the second phase is embedded in the first phase, wherein the first phase is processed in the form of a solder paste. This yields when the second phase is pressed therein. Subsequently, the other of the holding devices is placed on the solder preform to be produced. The integral spatial structure can also be embedded between two layers of the solder paste to increase the degree of filling. In the method, established techniques of stencil printing are applied, so that a cost-effective production process can advantageously be carried out with high reliability.

In some embodiments, the second phase is used in the form of an integral spatial structure and this spatial structure is immersed in the molten first phase. In this immersion method, the integral spatial structure is wetted using the solder material, wherein a diffusion zone immediately forms in the still liquid solder material. The spatial structures wetted with solder which are thus produced can subsequently be stacked to form taller solder preforms.

A solder preform 11 is shown in FIG. 1. It comprises a first joining surface 12 and a second joining surface 13. The solder preform 11 is connected to a first metallization 15 of a first joining partner 14 via the first joining surface 12. The joining partner 14 is embodied by an electronic component. The second joining surface 13 is connected to a second metallization 16 of a second joining partner 17. The second joining partner 17 is formed by a circuit carrier in the form of a printed circuit board.

The structure of the solder preform 11 is schematically shown. A state is shown in FIG. 1 in which the finished solder preform 11 has been placed between the first joining partner 14 and the second joining partner 17, but has not yet been soldered thereto. The solder preform 11 consists of layers of a second phase 18, which were formed from a metallic material, for example copper. Diffusion zones 19, which contain a tin-based solder material, into which copper from the second phase 18 has diffused, are located between the layers of this second phase 18 and/or adjoining them. This was achieved by a heat treatment of the solder preform, wherein this was terminated before the diffusion zones 19 were completely formed, however, intermetallic phases have already partially formed. Moreover, the diffusion zone 19 does not yet extend up to the first joining surface 12 and second joining surface 13, because of which these are formed by a first phase 20 made of the tin-containing solder material.

Figure 2:
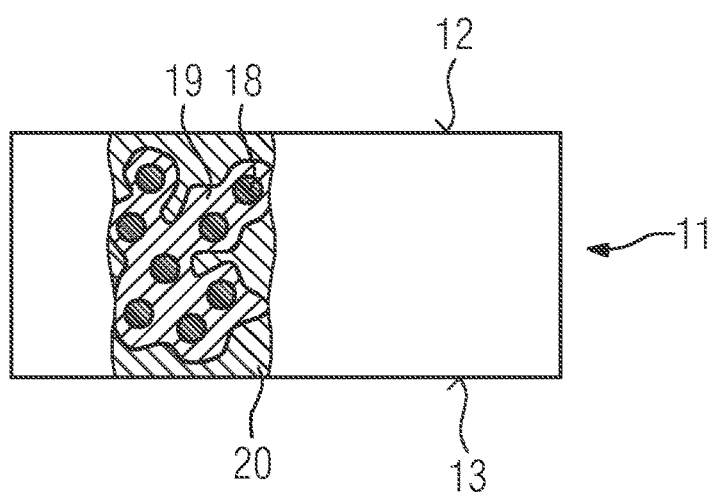
FIG. 2 shows another embodiment of a solder preform incorporating teachings of the present disclosure, in which the second phase is formed by particles, partially cut away.

The intermetallic compounds in the diffusion zones are not shown (more in this regard with respect to FIG. 2). These intermetallic compounds form still further during a soldering procedure still to follow, during which the first joining partner 14 and the second joining partner 17 are soldered to the solder preform 11 to form a solder connection. In this case, material diffuses out of the first metallization 15 and the second metallization 16 and also out of the second phase 18 of the solder preform into the first phase 20 of the solder preform and into the diffusion zones 19, whereby the concentration of copper atoms in the forming diffusion zone is sufficient to form intermetallic compounds. A diffusion solder connection thus results between the first joining partner and the second joining partner 17. Since the diffusion procedures have already begun in the solder preform 11, less energy is required for the final formation of the diffusion solder connection than in the case of conventional solder preforms which are used for this purpose.

In the solder preform shown in FIG. 2, the second phase 18 is contained in the form of particles in the first phase 20. A diffusion zone 19 has already (at least partially) formed as an intermetallic compound around the second phase 18. However, a distance of the second phase 18 from the first joining surface 12 and the second joining surface 13, which is selected in consideration of the diffusion paths of the second phase into the first phase (determined by the method parameters of the heat treatment such as temperature and duration) ensures that the first phase 20 of the solder material is present at these joining surfaces, to ensure a subsequent diffusion procedure with joining partners (not shown).

Figure 3:
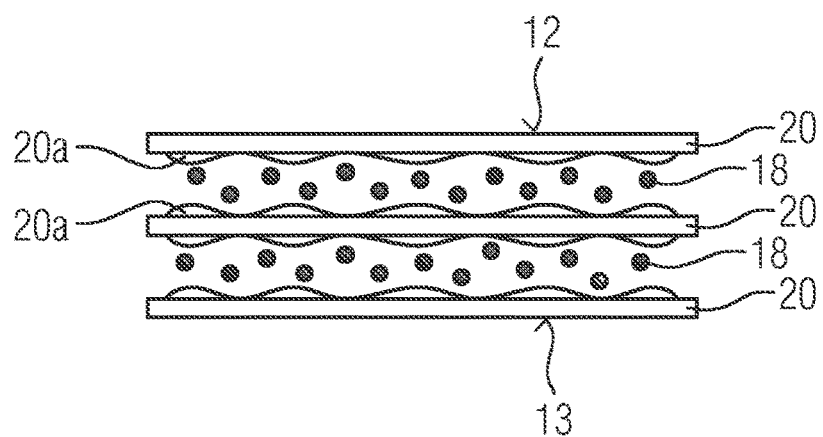
FIGS. 3 to 5 show selected manufacturing steps of an exemplary embodiment of a method incorporating teachings of the present disclosure (stacking of layers), in partial section.
Figure 4:
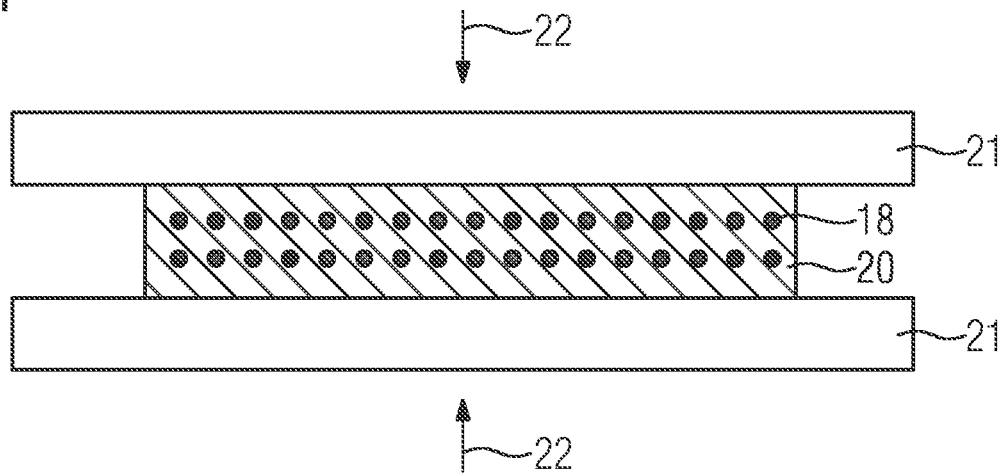
Figure 5:
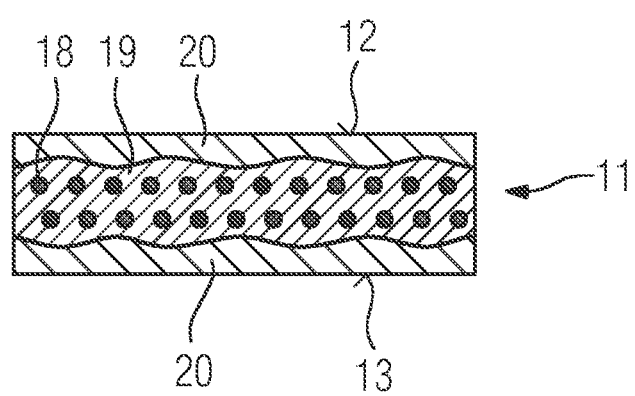

A solder preform according to FIG. 2 can be produced, for example, using a method of FIGS. 3 to 5. FIG. 3 shows that the first phase 20 in the form of solder foils can be layered alternately with the first phase 18 in the form of particles. The first phase 18 can be fixed in this case by means of an illustrated binder 20a on the second phase 20 (on one side or, as shown, on both sides of the layers of the second phase) or simply only scattered in (not shown). In this case, the respective uppermost and lowermost layer of the first phase 20 ensure that the second phase 18 is spaced apart from the first joining surface 12 and second joining surface 13 forming later.

FIG. 4 shows that the composite according to FIG. 3 held between two holding devices 21 in the form of ceramic plates. The first phase 20 and the second phase 18 are connected to one another and fixed in a preliminary manner by a contact pressure 22.

FIG. 5 shows the solder preform 11 after completed heat treatment, which can take place while the solder preform arising according to FIG. 4 is fixed in the holding device 21. The diffusion zone 19 has formed around the first phase 18, wherein the first phase 20 is present adjoining the first joining surface 12 and the second joining surface 13.

Figure 6:
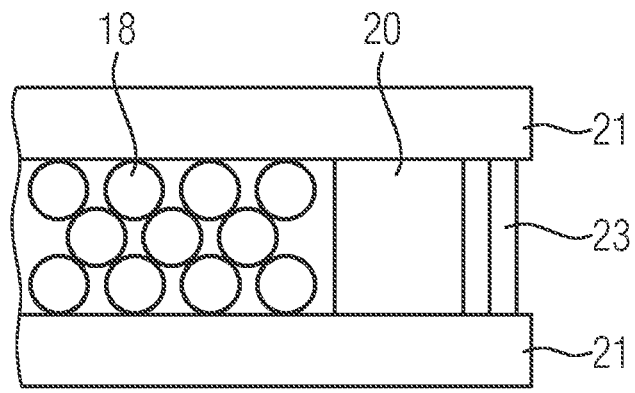
FIGS. 6 and 7 show another embodiment of a method incorporating teachings of the present disclosure, (infiltration with solder material) in selected steps, in partial section.
Figure 7:
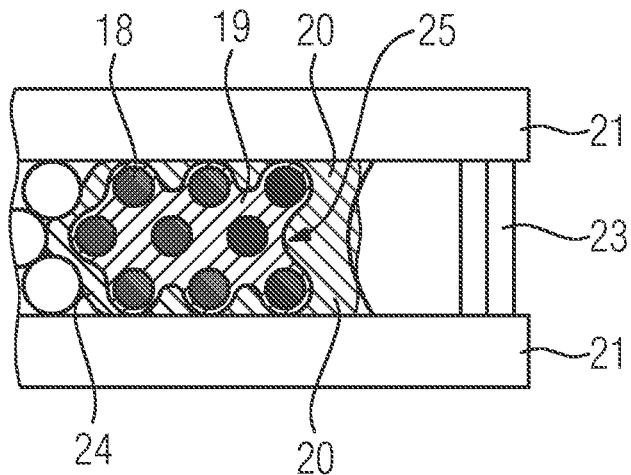

Another method for producing the solder preform is shown in FIGS. 6 and 7. It can be seen in FIG. 6 that the second phase 18 has the form of beads, which were layered uniformly between the holding devices 21. The first phase 20 of the solder material is formed by a preform, which is also held between the holding devices 21 and is located at the edges of the solder preform to be formed later. Moreover, a spacer 23 is provided, which defines the height of the solder preform to be formed.

FIG. 7 shows that the arrangement according to FIG. 6 is heated enough that the first phase 20 melts. The solder material now infiltrates the first phase 18 due to the capillary forces, which are generated by the intermediate spaces between the beads of the first phase 20. A front 24 of the solder material presently being introduced into the intermediate spaces of the second phase 18 can be seen in FIG. 7.

Since the solder material is liquid, a diffusion of the material of the second phase 18 (for example, copper) into the first phase occurs immediately, whereby a diffusion zone 19 made of intermetallic compounds results. This forms a framework 25 enclosing the beads of the second phase, which mechanically stabilizes the finished solder preform, so that it remains stable during the later formation of a solder connection while the remainder of the first phase 20 is melted again. The remainder of the first phase 20 is located in particular at the interfaces to the holding devices 21, which consist of a ceramic and therefore do not trigger diffusion procedures in the first phase 20 or may be wetted by the liquid first phase 20.

Figure 8:
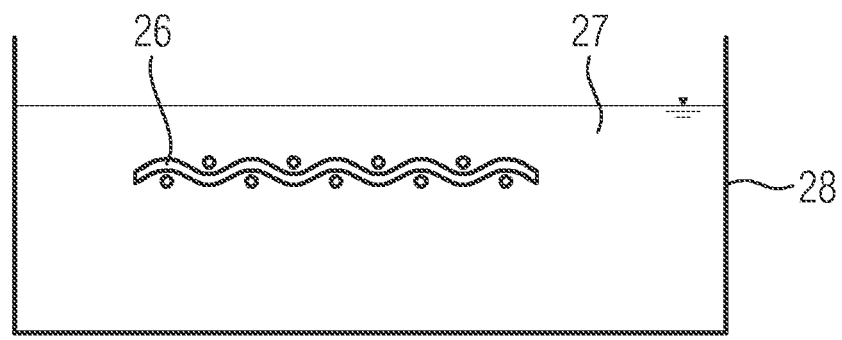
FIGS. 8 and 9 show another embodiment of a method incorporating teachings of the present disclosure (immersion of a spatial grating) in selected steps, in partial section.
Figure 9:
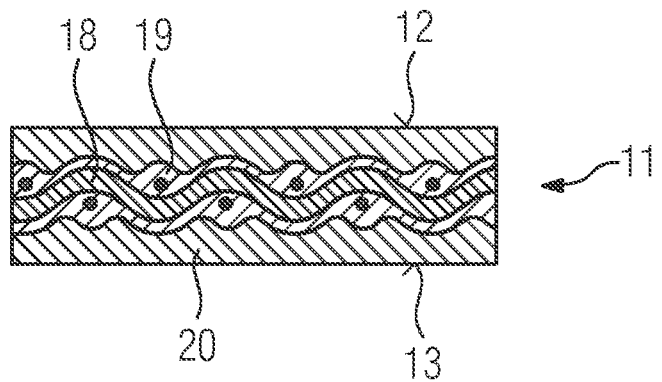

Another method for producing the solder preform is shown in FIGS. 8 and 9. In this method, the second phase is to be formed from a three-dimensional spatial structure 26, a wire grating here. To produce a solder preform from this spatial structure 26, it is immersed in liquid solder 27, which is provided in a container 28.

It can be seen in FIG. 9 that the spatial grating 26 from FIG. 8 forms the second phase 18 in the finished solder preform 11. This second phase is enclosed by the diffusion zone 19, wherein the first phase 20 detaches the diffusion zone 19 with increasing distance from the second phase 18, so that the first joining surface 12 and the second joining surface 13 are formed by the first phase 20.

Figure 10:
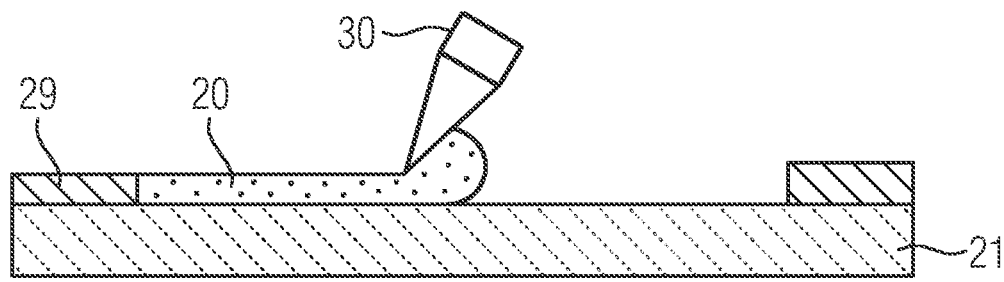
FIGS. 10 to 14 show selected steps of another embodiment of a method incorporating teachings of the present disclosure (solder paste printing), in partial section.
Figure 11:
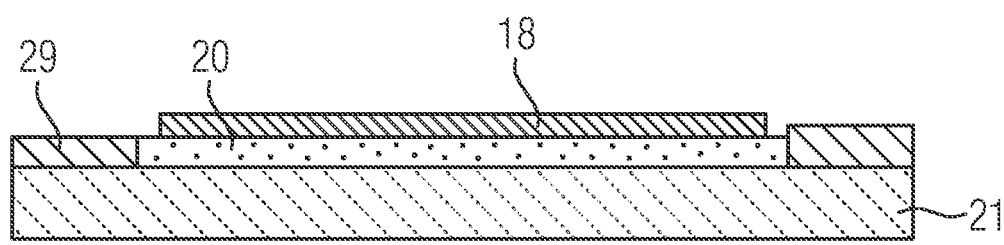
Figure 12:
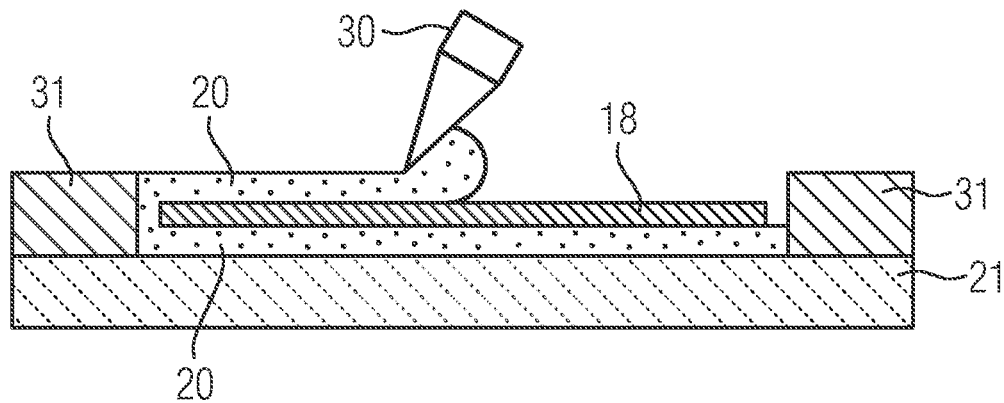

A method for producing the solder preform 11 by solder paste printing is shown in FIGS. 10 to 14. It can be seen in FIG. 10 that a first stencil 29 in the form of a ceramic plate is laid on the holding device 21 and the second phase 20 in the form of a solder paste is applied in a specific thickness by means of a squeegee 30. As can be inferred from FIG. 11, the second phase 18 in the form of a copper foil can be laid on the first phase 20 thus applied. Subsequently, as shown in FIG. 12, the first stencil 29 is replaced by a second stencil 31, which has a greater height. In some embodiments, the first stencil 29 can also remain on the holding device 21 and a further stencil can be laid on the first stencil 29. In any case, the cavity resulting due to the second stencil 31 thus also deepens, so that further solder paste can be metered by means of the squeegee 30 to produce the first phase 20. In this manner, the first phase 18 is enclosed in the second phase 20. This procedure can be repeated multiple times until the desired thickness for the solder preform is reached.

Figure 13:
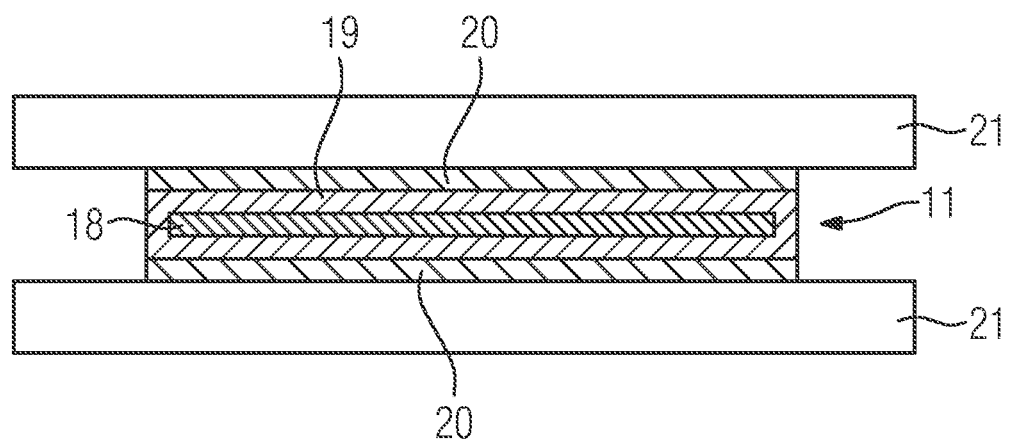

FIG. 13 shows how, in a following step, a solder preform 11 produced according to FIGS. 10 to 12 can be provided with a second holding device 21 and subjected to a heat treatment. The diffusion zone 19 having an intermetallic compound forms around the second phase 18 in this case, wherein the first phase 20 is present beyond the diffusion zone 19.

Figure 14:
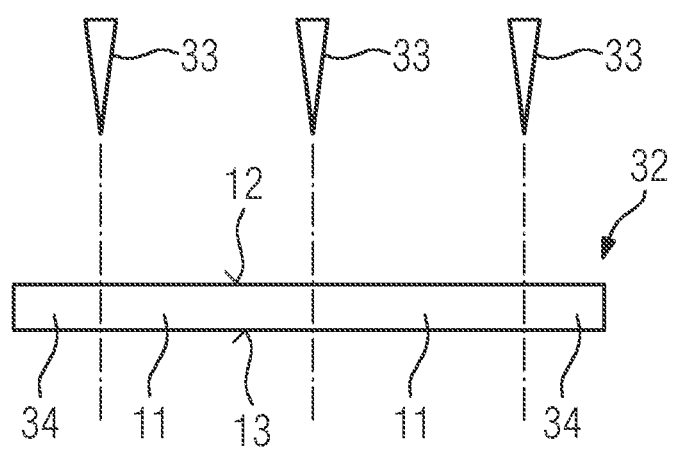

Instead of a single solder preform 11 according to FIG. 14, a plate 32, which has a substantially greater area than the solder preforms 11 to be produced, can also be produced as a component according to FIGS. 10 to 13. This plate 32 can then be isolated by means of a separating device 33, for example by stamping, i.e., the solder preforms 11 can be separated from one another (separation along the dot-dash lines). Edge regions 34, in which the required structure for the solder preform is not present or horizontal tolerances have an effect, can be trimmed off and discarded.

What is claimed is:

1. A solder preform for establishing a diffusion solder connection, the preform comprising:
    a microstructure including a solder material and a metallic material, wherein the solder material comprises layers and the metallic material comprises particles;
    wherein the layers and the particles are layered alternately and the particles are embedded in the layers;
    a first joining surface for a first joining partner and a second joining surface for a second joining partner; and
    a diffusion zone between each respective layer of solder material and metallic material, the diffusion zone comprising an intermetallic compound of at least some of the solder material and at least some of the particles;
    wherein the first joining surface and the second joining surface include at least some solder material.

2. The solder preform as claimed in claim 1, wherein a first minimum distance of at least 1 µm and at most 30 µm separates the diffusion zone from the first joining surface and a second minimum distance of at least 1 µm and at most 30 µm separates the diffusion zone from the second joining surface.

3. The solder preform as claimed in claim 1, wherein:
    a first minimum distance of at least 1 µm and at most 30 µm separates the diffusion zone from the first joining surface; and
    a second minimum distance of at least 1 µm and at most 30 µm separates the diffusion zone from the second joining surface;
    wherein the both the first minimum distance and the second minimum distance is present in a region below the joining surface of at least 50%.

4. The solder preform as claimed in claim 1, wherein the intermetallic compound is formed to a sufficient extent that a complete permeation of the solder preform by the diffusion zone from the first joining surface to the second joining surface can be formed in a soldering time of less than 300 seconds.

5. The solder preform as claimed in claim 1, wherein the intermetallic compound is formed to a sufficient extent that a complete permeation of the solder preform by the diffusion zone from the first joining surface to the second joining surface can be carried out in a temperature range of less than 270° C.

6. The solder preform as claimed in claim 1, wherein the diffusion zone comprises a framework connecting the particles, the framework comprising an intermetallic compound.

7. The solder preform as claimed in claim 1, wherein the metallic material forms an integral spatial structure enclosed by a matrix made of the solder material.

8. A method for producing a solder preform, the method comprising:
    joining a solder material and a metallic material together to form the solder preform, wherein the solder material comprises layers and the metallic material comprises particles;
    fixing the particles on the layers using a binder before the layers provided with the particles are layered;
    wherein the layers and the particles are layered alternately and the particles are embedded in the layers; and
    heat treating the solder preform;
    wherein a diffusion zone including an intermetallic compound between the solder material and the metallic material forms during the heat treatment; and
    the solder material remains at least partially formed on both a first joining surface for a first joining partner and a second joining surface for a second joining partner.

9. The method as claimed in claim 8, further comprising inserting the solder preform between two holding devices engaged on the first joining surface and the second joining surface respectively, during the heat treatment.

10. The method as claimed in claim 8, further comprising forming a plate as an intermediate product and obtaining a plurality of solder preforms by dividing the plate.

11. The method as claimed in claim 9, further comprising placing the metallic material comprising particles or an integral spatial structure between the holding devices; and
    wherein the metallic material is infiltrated by the molten solder material.

12. The method as claimed in claim 9, further comprising:
    placing the metallic material comprising an integral spatial structure on one of the holding devices;
    embedding the metallic material in the solder material comprising a solder paste; and
    placing the other of the holding devices on the solder preform to be produced.

13. The method as claimed in claim 12, further comprising embedding the integral spatial structure between two layers of the solder paste.

14. The method as claimed in claim 8, wherein:
    the metallic material comprises an integral spatial structure; and
    the spatial structure is immersed in the molten solder material.

* * * * *